United States Patent
Ohtani et al.

(10) Patent No.: US 6,700,133 B1
(45) Date of Patent: Mar. 2, 2004

(54) METHOD FOR PRODUCING SEMICONDUCTOR DEVICE

(75) Inventors: Hisashi Ohtani, Kanagawa (JP); Yasuhiko Takemura, Shiga (JP); Akiharu Miyanaga, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/664,352

(22) Filed: Sep. 18, 2000

Related U.S. Application Data

(62) Division of application No. 09/176,898, filed on Oct. 22, 1998, now Pat. No. 6,133,583, which is a division of application No. 08/839,940, filed on Apr. 18, 1997, now Pat. No. 5,851,862, which is a continuation of application No. 08/402,239, filed on Mar. 10, 1995, now abandoned.

(30) Foreign Application Priority Data

Mar. 11, 1994 (JP) .................................................. 6-67983

(51) Int. Cl.$^7$ .............................................. H01L 29/76
(52) U.S. Cl. ............................. 257/66; 257/65; 257/67; 257/69; 257/70; 257/51
(58) Field of Search ............... 257/65–70, 64, 257/51

(56) References Cited

U.S. PATENT DOCUMENTS

| | | | | |
|---|---|---|---|---|
| 4,409,605 A | * | 10/1983 | Ovshinsky et al. | ............. 357/2 |
| 4,740,829 A | * | 4/1988 | Nakagiri et al. | .............. 357/59 |
| 4,766,477 A | * | 8/1988 | Nakagawa et al. | ........... 357/59 |
| 4,814,842 A | * | 3/1989 | Nakagawa et al. | ........ 357/23.7 |
| 4,822,751 A | * | 4/1989 | Ishizu et al. | ................. 437/173 |
| 5,094,966 A | * | 3/1992 | Yamazaki | |
| 5,147,826 A | | 9/1992 | Liu et al. | |
| 5,153,702 A | | 10/1992 | Aoyama et al. | |
| 5,250,931 A | * | 10/1993 | Misawa et al. | ............. 345/206 |
| 5,264,072 A | | 11/1993 | Mukai | |
| 5,275,851 A | * | 1/1994 | Fonash et al. | ............... 427/578 |

(List continued on next page.)

FOREIGN PATENT DOCUMENTS

| | | |
|---|---|---|
| JP | 62-181419 | 8/1987 |
| JP | 62-219123 | 9/1987 |

(List continued on next page.)

OTHER PUBLICATIONS

C. Hayzelden et al., "In Situ Transmission Electron Microscopy Studies of Silicide-Mediated Crystallization of Amorphous Silicon" J. Appl. Phys., vol. 73, No. 12, (1993), pp. 8279–8281.

(List continued on next page.)

*Primary Examiner*—Eddie Lee
*Assistant Examiner*—Eugene Lee
(74) *Attorney, Agent, or Firm*—Eric J. Robinson; Robinson Intellectual Property Law Office, P.C.

(57) ABSTRACT

A film having a high thermal conductivity material such as aluminum nitride is formed on a substrate, and then a silicon film is formed. When a laser light or an intense light corresponding to the laser light is irradiated to the silicon film, since the aluminum nitride film absorbs heat, a portion of the silicon film near the aluminum nitride film is solidified immediately. However, since a solidifying speed is slow in another portion of the silicon film, crystallization progresses from the portion near the aluminum nitride film. When a substrate temperature is 400° C. or higher at laser irradiation, since a solidifying speed is decreased, a crystallinity of the silicon film is increased. Also, when the substrate is thin, the crystallinity of the silicon film is increased.

46 Claims, 4 Drawing Sheets

U.S. PATENT DOCUMENTS

| | | | |
|---|---|---|---|
| 5,296,653 A | * | 3/1994 | Kiyota et al. |
| 5,308,998 A | | 5/1994 | Yamazaki et al. |
| 5,323,042 A | * | 6/1994 | Matsumoto ............... 257/350 |
| 5,334,859 A | * | 8/1994 | Matsuda |
| 5,352,907 A | | 10/1994 | Matsuda et al. |
| 5,403,772 A | | 4/1995 | Zhang et al. |
| 5,424,244 A | | 6/1995 | Zhang et al. |
| 5,432,122 A | | 7/1995 | Chae |
| 5,485,019 A | * | 1/1996 | Yamazaki et al. ............ 257/57 |
| 5,492,843 A | | 2/1996 | Adachi et al. |
| 5,650,338 A | | 7/1997 | Yamazaki et al. |
| 5,696,386 A | * | 12/1997 | Yamazaki ................. 257/347 |
| 5,744,818 A | * | 4/1998 | Yamazaki et al. ........... 257/57 |
| 5,766,344 A | | 6/1998 | Zhang et al. |
| 5,773,327 A | | 6/1998 | Yamazaki et al. |
| 5,796,116 A | * | 8/1998 | Nakata et al. ............... 257/66 |
| 5,851,862 A | | 12/1998 | Ohtani et al. |
| 5,897,347 A | | 4/1999 | Yamazaki et al. |
| 5,913,112 A | | 6/1999 | Yamazaki et al. |
| RE36,314 E | | 9/1999 | Yamazaki et al. |
| 5,962,870 A | | 10/1999 | Yamazaki et al. |
| 6,023,075 A | * | 2/2000 | Yamazaki ................... 257/72 |
| 6,133,583 A | * | 10/2000 | Ohtani et al. |
| 6,331,723 B1 | | 12/2001 | Yamazaki et al. |

FOREIGN PATENT DOCUMENTS

| | | | |
|---|---|---|---|
| JP | 63-102265 | | 5/1988 |
| JP | 63-219123 | | 9/1988 |
| JP | 63-265469 | | 11/1988 |
| JP | 63-307431 | | 12/1988 |
| JP | 01-276616 | | 11/1989 |
| JP | 02-054538 | | 2/1990 |
| JP | 02-140915 | | 5/1990 |
| JP | 02-275641 | | 11/1990 |
| JP | 2-297923 | | 12/1990 |
| JP | 02-301132 | * | 12/1990 |
| JP | 3-30433 | | 2/1991 |
| JP | 3-62971 | | 3/1991 |
| JP | 3-295267 | | 12/1991 |
| JP | 04-307521 | | 10/1992 |
| JP | 04307521 | * | 10/1992 |
| JP | 5-21343 | | 1/1993 |
| JP | 05-114724 | | 5/1993 |
| JP | 5-198507 | | 8/1993 |
| JP | 5-206468 | | 8/1993 |
| JP | 5-275328 | | 10/1993 |
| JP | 6-34997 | | 2/1994 |
| JP | 7-106599 | | 4/1995 |
| JP | 07-249779 | | 9/1995 |

OTHER PUBLICATIONS

A.V. Dvurechenskii et al., "Transport Phenomena in Amorphous Silicon Doped by Ion Implantation of 3d Metals", Phys. Stat. Sol. (a) vol. 95, (1986) pp. 635–640.

T. Hempel et al., "Needle–Like Crystallization of Ni Doped Amorphous Silicon Thin Films", Solid State Communications, vol. 85, No. 11, pp. 921–924, (1993).

R. Kakkad et al., "Crystallized Si Films by Low–Temperature Rapid Thermal Annealing of Amorphous Silicon", J. Appl. Phys. vol. 65, No. 5, Mar. 1, 1989, pp. 2069–2072.

G. Liu et al., "Polycrystalline Silicon Thin Film Transistors on Corning 7059 Glass Substrates using Short Time, Low Temperature Processing", Appl. Phys. Lett. vol. 62, No. 20, May 17, 1993, pp. 2554–2556.

G. Liu et al., "Selective Area Crystallization of Amorphous Silicon Films by Low–Temperature Rapid Thermal Annealing", Appl. Phys. Lett. vol. 55, No. 7, Aug. 14, 1989, pp. 660–662.

R. Kakkad et al., "Low Temperature Selective Crystallization of Amorphous Silicon", Journal of Non–Crystalline Solids, vol. 115, (1989), pp. 66–68.

H.W. Lam et al., "Characteristics of MOSFETS Fabricated in Laser–Recrystallized Polysilicon Islands with a Retaining Wall Structure on an Insulating Substrate", IEEE Electron Device Letters, vol. EDL–i (1980), pp. 206–208.

K. Egami et al., "Laser Crystallization of Silicon Stripes in $SiO_2$ Grooves with a Polycrystalline Silicon Sublayer", Appl. Phys. Lett., vol. 43, No. 11, Dec. 1, 1983, pp. 1023–1025.

D. Choi et al., "Drastic Enlargement of Grain Size of Excimer–Laser–Crystallized Polysilicon Films", Jpn, J. App. Phys., vol. 31, Part 1, No. 12B, Dec. 1992, pp. 4545–4549.

C. Hayzelden et al., "In Situ Transmission Electron Microscopy Studies of Silicide–Mediated Crystallization of Amorphous Silicon", Appl. Phys. Lett., vol. 60, No. 2, Jan. 13, 1992, pp. 225–227.

* cited by examiner

METHOD FOR PRODUCING SEMICONDUCTOR DEVICE

This application is a Divisional of application Ser. No. 09/176,898 filed Oct. 22, 1998, now U.S. Pat. No. 6,133,583 which itself is a Divisional of Ser. No. 08/839,940 filed Apr. 18, 1997, now U.S. Pat. No. 5,851,862; which is a Continuation of Ser. No. 08/402,239 filed Mar. 10, 1995, abandoned.

BACKGROUND OF THE INVENTION

The present invention relates to a method for producing a semiconductor device using a semiconductor having crystallinity.

A thin film transistor (TFT) and a thin film diode (TFD) using a crystalline silicon thin film semiconductor are well know. The TFT and TFD are constructed by forming a thin film semiconductor on an insulting substrate or an insulating surface formed on a semiconductor substrate. The TFT is used in various integrated circuits. In particular, the TFT may be used as a switching element to be formed in each pixel of an active matrix type liquid crystal display device, a driver element formed in a peripheral circuit portion, and an element of a three dimensional integrated circuit.

To obtain crystalline silicon film used in such elements, a method for heating an amorphous silicon film at 600° C. or higher is well known. In this method, a crystalline silicon film is obtained by solid-phase-growing a silicon film having an amorphous state (an amorphous silicon film). Also, to obtain a crystalline silicon film, a method for melting a silicon film by irradiating a laser light or an intense light corresponding to the laser light and then cooling the silicon film for solidification is well known.

However, a silicon film obtained by these methods is polycrystalline. Therefore, since there are grain boundaries in the silicon film, characteristics of a TFT having such silicon film are inferior to that of a TFT having a single crystalline silicon film. In addition, since a generating position of grain boundaries cannot be adjusted, variations in characteristics of TFTs to be formed are extremely large.

SUMMARY OF THE INVENTION

The object of the present invention is to solve the above problem, and to obtain a silicon film having a high crystallinity by adjusting progress of crystallization and a generating position of grain boundaries.

In the present invention, a silicon film is melted by irradiating a pulse laser light or an intense light (coherent light or incoherent light) corresponding to the pulse laser light, that is, a light energy which an output is varied largely. After irradiating the light energy, solidification is adjusted by providing two dimensional differences in a cooling speed of a silicon film. On portion of silicon film in which a cooling sped is speed is fast is crystallized early by solidification. Another portion if the silicon film in which the cooling speed is slow produces a state which crystallization is not made. In such state, since the crystallization portion becomes nucleus, a crystal growth extends from one portion to the another portion. As a result, obtained crystalline silicon has an extremely high crystallinity. When a suitable condition is set, a substantially single crystalline silicon film in which grain boundaries are not present in an area of 10 μm to 1 mm square can be obtained.

In the present invention, in order to obtain the above cooling speed distribution, a film having a high thermal (heat) conductivity material such as aluminum nitride, boron nitride, and diamond may be formed selectively. These materials may be crystalline or amorphous.

A silicon film is formed directly or indirectly on or under the high thermal conductivity material film. When the high thermal conductivity material film is formed on the silicon film, this film can be removed after crystallization processing. Therefore, degree of freedom in a device structure is increased. Also, when diamond is selected as the high thermal conductivity material, it can be removed by oxidation easily using hydrogen plasma processing-or the like.

In the present invention, a silicon film may be amorphous, microcrystalline, or polycrystalline. The silicon film is selected in accordance with absorbency of the laser light or the like. When the silicon film having crystallinity is not completely melted, remaining portions of the silicon film become nucleus, so that another crystal growth different from the crystal growth in the present invention may produce.

To further effectively obtain a silicon film having a high crystallinity in the present invention, the silicon film may be heated at 400° C. or higher when irradiating a laser light or the like. Since this heating decreases generally a cooling speed after a laser irradiation, it is effective in progress of crystal growth.

A substrate may be thin. Since the substrate also operates as a heat sink, heat supplied to the silicon film by irradiating a laser light or the like is absorbed immediately by the substrate. When the substrate is thick, a thermal capacity is large, and it tends to enhance this relationship. On the other hand, when the substrate is thin and is surrounded by a thermal insulating material, heat diffusion is prevented. This also decreases generally a cooling speed after a laser irradiation, it is effective in progress of crystal growth.

When there is a problem in a mechanical stress by thinning the whole substrate, the same effect is obtained by thinning only necessary the portion of the substrate. For example, a hole is formed in only portion of the substrate corresponding to a region in which a thin film transistor (TFT) is formed.

It is further effective when a method for heating a silicon film combines with a method for thinning a substrate.

When a TFT is formed using the above obtained silicon film having a high crystallinity, a portion having a single crystalline state or a substantially single crystalline state may be formed as a channel forming region of the TFT. The substantially single crystalline state does not represent a complete crystalline state but a state wherein through it is necessary to neutralize dangling bonds in a crystalline region by adding hydrogen or halogen element, a crystal orientation other than a main crystal orientation is 1% or less by a structure analysis method such as an X-ray diffraction method and a Raman scattering spectroscopic analysis (a state that crystal orientation is aligned largely). Since such single crystalline state or substantially single crystal state is not obtained in a region in which a high thermal conductivity material film is formed, essentially a channel forming region is formed in another region other than the region in which the high thermal conductivity material film is formed.

In the present invention, a crystal nucleus always produces at a desired position in a cooling process after a laser irradiation. A crystal growth stably occurs from the desired position. Therefore, the crystallization process has extremely high reproducibility. Also, a variation in crystallinity due to a change of laser energy is sufficiently small, so that a yield of a thin film semiconductor device to be obtained is extremely high.

DETAILED DESCRIPTION OF THE PREFERRED EMBODIMENTS

Embodiment 1

FIGS. 1A to 1E shows processes for forming a thin film transistor (TFT) on a glass substrate. In the embodiment, a substrate 101 is a Corning 7059 glass having a thickness of 1.1 mm or 30 μm.

Figure 1A:
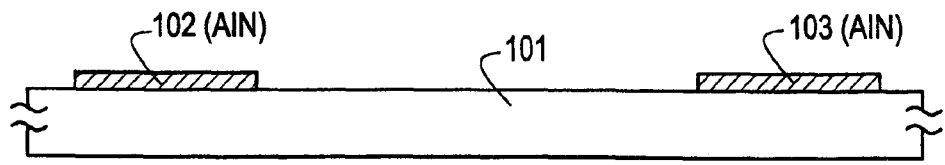
FIGS. 1A to 1E are views illustrating TFT forming processes according to an embodiment of the present invention.

An aluminum nitride (AlN) film having a thickness of 200 to 5000 Å, preferably, 300 to 1000 Å is formed by sputtering, in particular, reactive sputtering. A ratio of nitrogen and aluminum in the aluminum nitride film is preferably 0.8 to 1.2. The formed aluminum nitride film is selectively etched to form aluminum nitride regions 102 and 103. (FIG. 1A)

In the embodiment, although the regions 102 and 103 are formed by the same material, the regions 102 and 103 may be formed by different materials. For example, the region 102 may be formed by a high thermal conductivity material and the region 103 may be formed by a low thermal conductivity material.

After that, a silicon oxide film ($SiO_2$) 104 having a thickness of 500 to 5000 Å, preferably, 500 to 3000 Å is formed by plasma CVD. To improve thermal conduction, the silicon oxide film 104 prefers as thin as possible.

An amorphous silicon film having a thickness of 100 to 1000 Å, preferably, 400 to 800 Å, for example, 500 Å is formed by plasma CVD and low pressure CVD (LPCVD). In the embodiment, an amorphous silicon film 105 having a thickness of 1000 Å is formed by plasma CVD.

Also, a KrF excimer laser (wavelength of 248 nm and pulse width of 30 ns) is irradiated in vacuum. An energy density of the laser to be irradiated is 200 to 450 mJ/cm². The number of shots is 2 to 5 shots for each portion. A substrate temperature is a room temperature (RT) or 500° C. The laser may include a ultraviolet laser such as an XeCl excimer laser (wavelength of 308 nm) and an ArF excimer laser (wavelength of 193 nm), a visible light laser such as a ruby laser, and an infrared laser such as a Nd:YAG laser. However, the laser to be irradiated is a pulse oscillating laser.

Figure 1B:
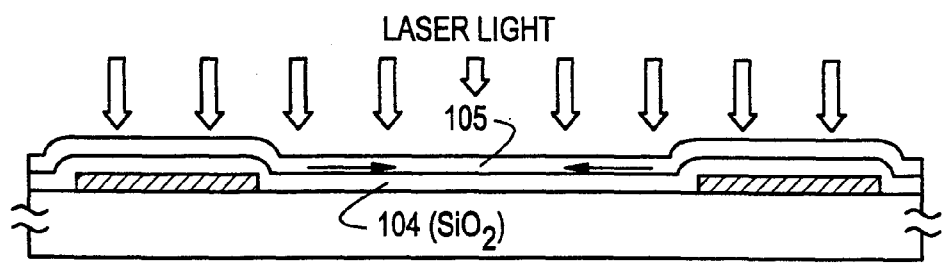
Figure 3:
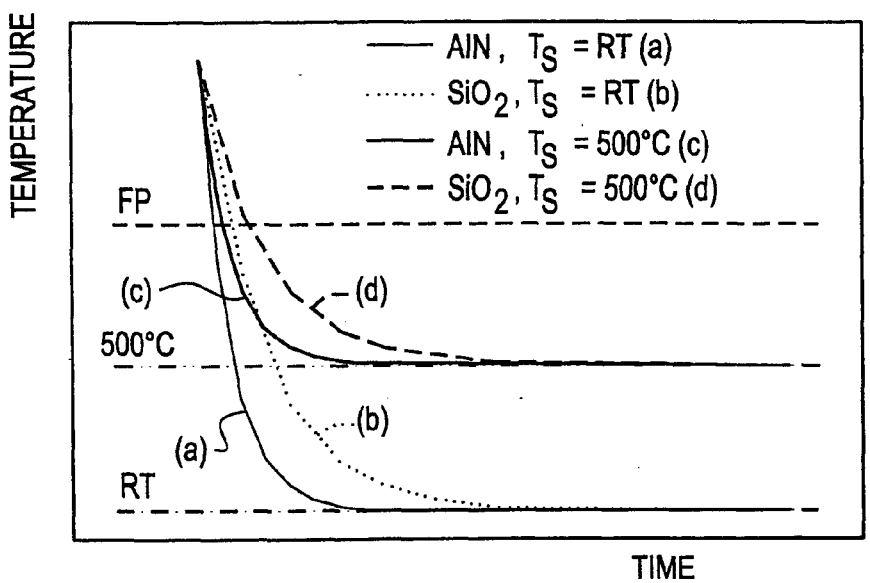
FIGS. 3 and 4 are diagrams illustrating temperature changes of a silicon film after laser irradiation.

FIG. 3 shows a temperature change of a silicon film immediately after laser irradiation under such condition. In FIG. 3, RT represents a room temperature, FP represents a freezing point, and Ts represents a substrate temperature. From FIG. 3, a temperature on aluminum nitride (AlN) (solid lines (a) and (c)) decreases largely in comparison with a temperature on another region such as silicon oxide ($SiO_2$) (dot lines (b) and (d)). Also, transfer quantity of heat is large and the temperature decreases largely in a case wherein a substrate is maintained at a room temperature (Ts=RT) in comparison with a case wherein a substrate is maintained at 500° C. (Ts=500° C.). A time when a temperature state of a freezing point (PT) temperature or higher is maintained, on the aluminum nitride, is shorter than that on the silicon oxide, and also the maintaining time in the case wherein the substrate is maintained at the room temperature is shorter than that in the case wherein the substrate is maintained at 500° C. As a result, when the substrate temperature is the room temperature, crystallization (as an arrow shown in FIG. 1B) from the aluminum nitride region to a peripheral region is not observed. On the other hand, when the substrate temperature is 500° C., a crystal growth having a length of 10 to 100 μm, as the arrow of FIG. 1B is observed.

Figure 6A:
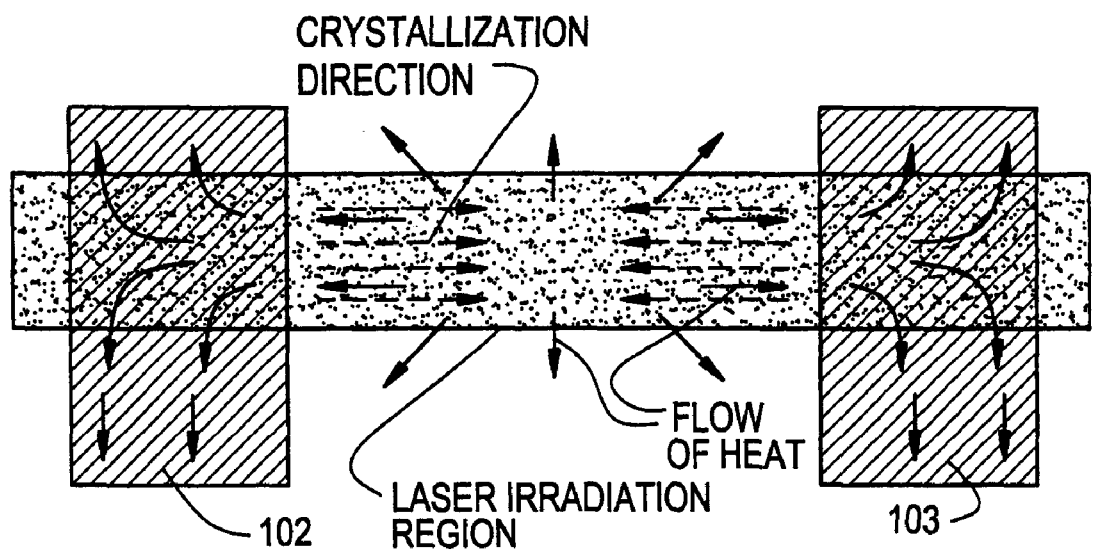
FIGS. 6A and 6B are views illustrating flow of heat and crystallization direction in a silicon film at laser irradiation.

Flow of heat will be described in the above state. When a laser irradiation region into which a laser beam is irradiated does not cover a region surrounded by the aluminum nitride regions 102 and 103 or when the aluminum nitride regions 102 and 103 is apart from each other (as shown in FIG. 6A), heat energy supplied to the silicon film transmits to surrounding regions. Since a speed which heat diffuses to a region into which a laser is not irradiated through the aluminum nitride film is fast, heat mainly transmits one dimensionally to the aluminum nitride regions along the laser irradiation region.

In FIG. 6A, an arrow by a solid line represents flow of heat. A thick line represents that flow of heat is fast. FIG. 6A shows mainly that heat flows to the aluminum nitride regions. Although heat also flows from the laser irradiation region to another region, heat quantity is less. By such flow of heat, a crystallization direction is opposite to a main flow direction of heat as shown in an arrow by a dot line of FIG. 6A. Also, crystals grown from both aluminum nitride regions are collided in a center of the laser irradiation region, so that a portion which distortion of crystallization is concentrated produces. (FIG. 6A)

Figure 6B:
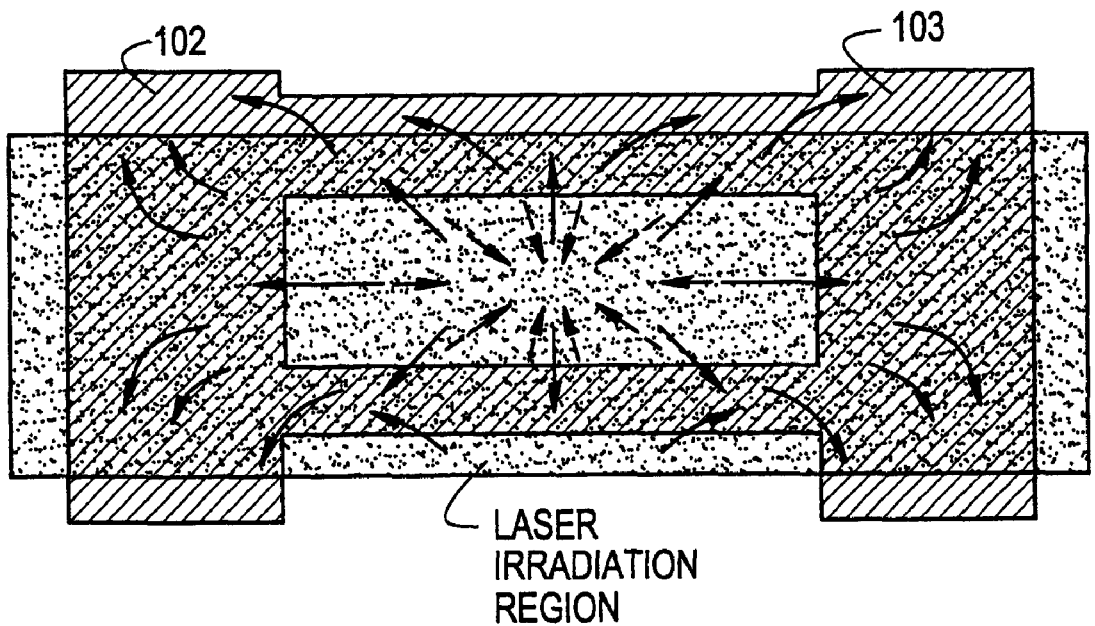

On the other hand, when a laser is irradiated to a whole region surrounded by an aluminum nitride region (FIG. 6B), heat flows two dimensionally, so that crystallization progresses to a center portion of the region surrounded by the aluminum nitride region at a direction opposite to a direction of flow of heat. In this case, a portion which distortion of crystallization is concentrated produces in the center portion. (FIG. 6B)

In both cases, such portion having large distortion of crystallization is not suitable as a channel forming region of a TFT.

Figure 4:
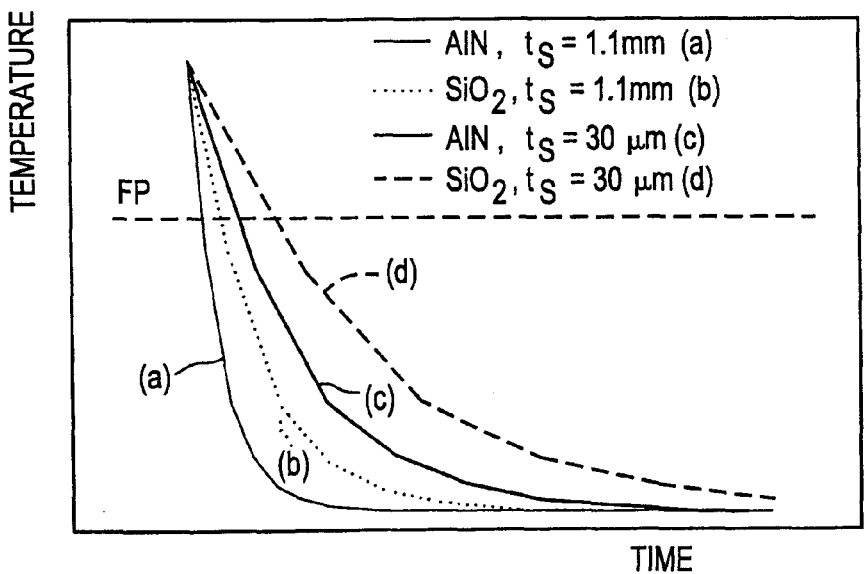

If a thickness of a substrate is changed, the above mentioned behavior is observed. FIG. 4 shows a temperature change of a silicon film immediately after laser irradiation in a case wherein a thickness of the substrate is 1.1 mm and 30 μm. A laser irradiation is performed at a room temperature in a vacuum. To avoid thermal conduction, the substrate is supported by holding only both ends without using a suscepter or the like. In FIG. 4, FP represents a freezing point and $t_s$ represents a thickness of the substrate. From FIG. 4, even if a thickness of the substrate is the same, a temperature on aluminum nitride (AlN) (solid lines (a) and (c)) decreases largely in comparison with a temperature on another region such as silicon oxide ($SiO_2$) (dot lines (b) and (d)). Also, the temperature decreases slowly in a case wherein the substrate is thin ($t_s$=30 μm) in comparison with a case wherein the substrate is thick ($t_s$=1.1 mm). As a result, even if a laser is irradiated at a room temperature, when a thickness of the substrate is thin and 30 μm and when is a thermal insulating state is maintained, as an arrow shown in FIG. 1B, crystallization from the aluminum nitride region to a peripheral region is observed in a length of 10 to 1000 μm.

When the above thin substrate is heated at 400° C. or higher by an infrared lamp or the like in a thermal insulating state and then laser irradiation is performed, a silicon film having further high crystallinity can be obtained. From the above, the silicon film is crystallized. (FIG. 1B)

To further improve crystallization of a silicon film or increase a crystallinity of the silicon film, an element such as nickel for promoting crystallization is added to the silicon film at a concentration of $1 \times 10^{15}$ to $1 \times 10^{19}$ atoms/cm$^3$.

Figure 1C:
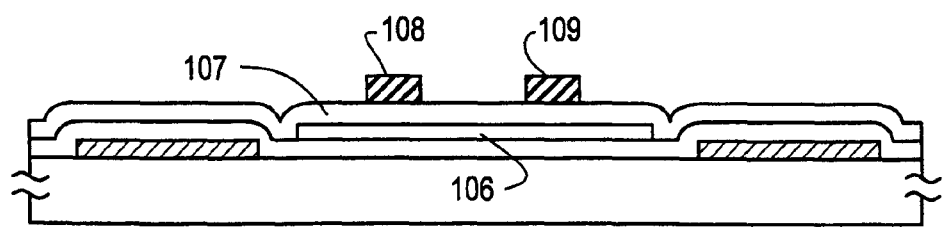
Figure 1D:
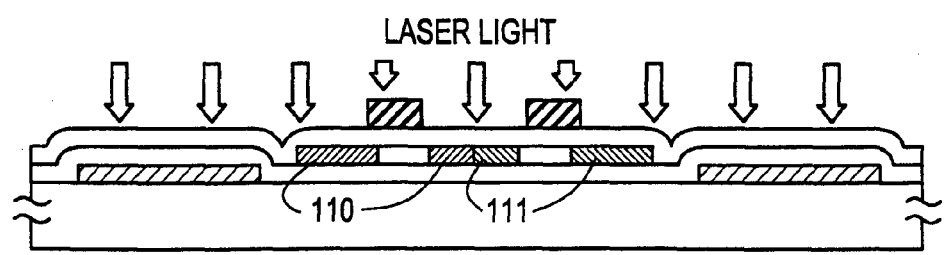
Figure 1E:
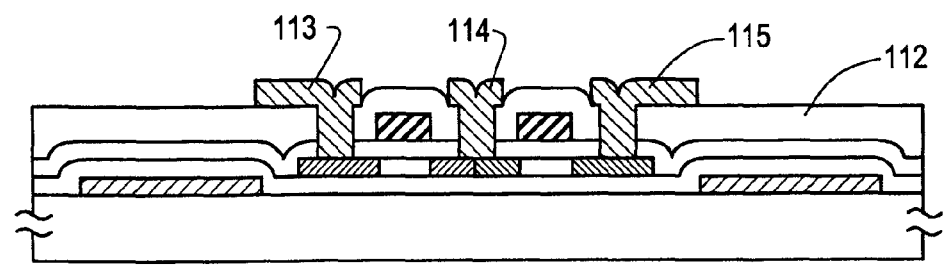

After the above laser irradiation, the silicon film is patterned and etched to form an island like silicon film region 106. Also, a silicon oxide film 107 having a thickness of 500 to 2000 Å, preferably, 700 to 1500 Å is formed as a gate oxide film by plasma CVD. Further, a polycrystalline silicon film having a thickness of 2000 Å to 1 μm is formed by LPCVD and then patterned and etched to form gate electrodes 108 (for an N-channel type TFT) and 109 (for a P-channel type TFT). To increase a conductivity, phosphorus is doped into the polycrystalline silicon film at 1 ppm to 5 atoms %. (FIG. 1C)

After that, impurities (phosphorus and boron) are implanted into an island like silicon film of each TFT by ion doping (plasma doping) using a gate electrode portion as a mask in a self-alignment. A doping gas is phosphine (PH$_3$) in phosphorus doping and diborane (B$_2$H$_6$) in boron doping. A dose is $5 \times 10^{14}$ to $6 \times 10^{15}$ cm$^{-2}$. Doping is performed alternately using a mask.

A KrF excimer laser (wavelength of 248 nm and pulse width of 30 ns) is irradiated to increase a crystallinity of a portion which a crystallinity is decreased by introducing the above impurities. An energy density of a laser is 150 to 400 mJ/cm$^2$, preferably, 200 to 250 mJ/cm$^2$. As a result, an N-type impurity (phosphorus) region 110 and a P-type impurity (boron) region 111 are formed. A sheet resistance of these regions is 200 to 800 Ω/square.

This process may be performed by increasing a temperature up to 1000 to 1200° C. (a silicon monitor temperature) for a short time using a flash lamp for generating an intense light corresponding a laser light instead of the laser light and heating an object. This is called a rapid thermal anneal (RTA) or a rapid thermal process (RTP).

After that, a silicon oxide film having a thickness of 3000 to 8000 Å is formed as an interlayer insulator 112 by plasma CVD at a substrate temperature of 250 to 450° C., for example, 350° C. A film formation is performed under a condition that a flat film can obtained. To obtain further planerization on a surface, it is effective to mechanically polish the silicon oxide film.

The interlayer insulator 112 is etched to contact holes in a source and a drain in a TFT and then interconnects (wirings) 113 to 115 of chromium or titanium nitride are formed. Hydrogenation of silicon is completed by annealing for 0.1 to 2 hours at 300 to 400° C. in an atmosphere containing hydrogen. The hydrogenation may be performed by implanting an accelerated hydrogen ion at 0.001 to 5 atoms % by ion doping. As a result, A TFT is completed.

A mobility of the TFT produced by the embodiment is typically 150 to 750 cm$^2$/Vs in an N-channel type and 100 to 450 cm$^2$/Vs in a P-channel type. Also, a sub-threshold characteristic value (S value) is 0.05 to 0.15 digit/v and similar to that of a MOS transistor having a single crystalline silicon. In the embodiment, since a TFT is formed on an insulating substrate, when a circuit is constructed, a parasitic capacitance to the substrate does not produce. Therefore, a high speed operation is achieved with lower consumption power in comparison with a MOS transistor circuit formed on a conventional semiconductor substrate.

Embodiment 2

FIGS. 2A to 2E show TFT forming processes of another embodiment. A substrate is Corning 7059 having a thickness of 1.1 mm. A silicon oxide film 202 having a thickness of 1000 to 5000 Å, for example, 2000 Å is formed as a base film on a substrate 201 by plasma CVD. An intrinsic (I-type) amorphous silicon film 203 having a thickness of 100 to 1000 Å, for example, 500 Å is formed by plasma CVD. Next, a polycrystalline diamond film having a thickness of 500 to 5000 Å, for example, 1000 Å is formed by plasma CVD and then selectively etched to form polycrystalline diamond regions 204 and 205.

In the embodiment, although the regions 104 and 105 are formed by the same material, the regions 104 and 105 may be formed by different materials. For example, the region 104 may be formed by a high thermal conductivity material and the region 105 may be formed by a low thermal conductivity material.

Figure 2A:
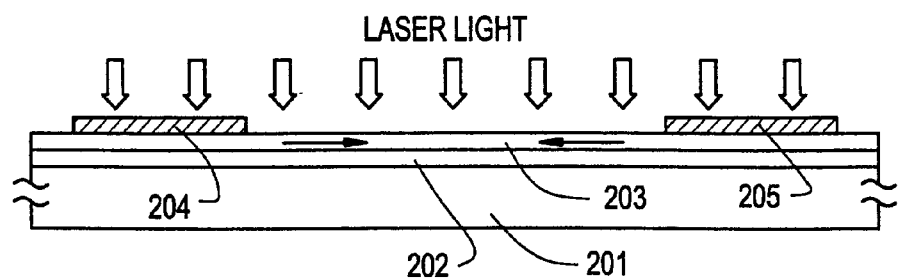
FIGS. 2A to 2E are views illustrating TFT forming processes according to another embodiment of the present invention.

As similar to Embodiment 1, a KrF excimer laser (wavelength of 248 nm) is irradiated in vacuum to crystallize the silicon film 203. An energy density is 200 to 350 mJ/cm$^2$ and the number of shots is 5 shots for each portion. A substrate temperature is 500° C. As a result, as shown in an arrow of FIG. 2A, crystallization of the silicon film 203 progresses. (FIG. 2A)

To further improve crystallization of a silicon film or increase a crystallinity of the silicon film, an element such as nickel for promoting crystallization is added to the silicon film at a concentration of $1 \times 10^{15}$ to $1 \times 10^{19}$ atoms/cm$^3$.

Figure 2B:
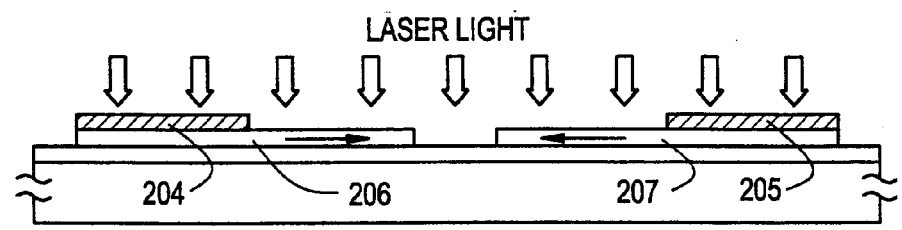
Figure 2C:
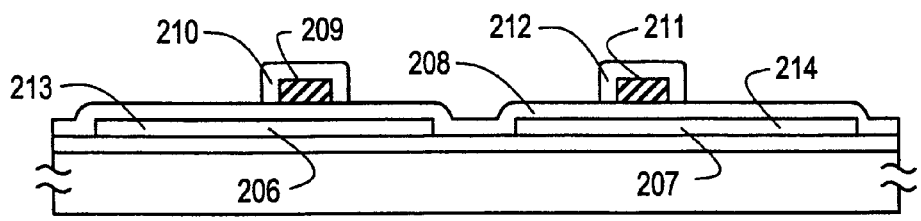

Laser irradiation may be performed after patterning and etching of the silicon film 203 to form island like silicon film regions 206 and 207, as shown in FIG. 2B. The polycrystalline diamond film transmits sufficiently a laser light to be used. However, the silicon film formed under the polycrystalline diamond film is not crystallized sufficiently.

The polycrystalline diamond films 204 and 205 are oxidized by placing them in an oxygen plasma. A remaining portion of the polycrystalline diamond films (mainly amorphous carbon) can be removed completely by washing using hydrogen peroxide sulfate water.

The silicon film 203 is patterned and etched to form the island silicon film regions 206 and 207. Regions 213 and 214 in the regions 206 and 207 are formed under the polycrystalline diamond and a crystallinity of a silicon film is extremely low. However, in the embodiment, since such regions are used as a region other than a channel forming region of a TFT, no problem produces.

A silicon oxide film having a thickness of 500 to 2000 Å, for example, 1200 Å is deposited by plasma CVD, and then an aluminum (containing scandium of 0.01 to 0.2 weight %) film having a thickness of 3000 to 8000 Å, for example, 6000 Å is formed by sputtering. Further, the aluminum film is patterned to form gate electrodes 209 (for an N-channel type TFT) and 211 (for a P-channel type TFT).

These aluminum gate electrodes are anodized to form oxide layers 210 and 212 on surfaces of the electrodes. Anodization is performed in an ethylene glycol solution containing tartaric acid of 1 to 5%. A thickness of the formed oxide layers 210 and 212 is about 2000 Å. Since the oxide layers 210 and 212 are concerned with a thickness forming an offset gate region in an ion doping process, a length of the offset gate region can be determined in the above anodization process. (FIG. 2C) Next, by ion doping (plasma doping), an N-type impurity (phosphorus) and a P-type impurity (boron) are added into the island like silicon film regions 206 and 207 using a gate electrode portion (the gate electrodes 209 and 211 and the surrounding oxide layers 210 and 212) as a mask in a self-alignment. A dose is $5 \times 10^{14}$ to $8 \times 10^{15}$ cm$^{-2}$, for example, $1 \times 10^{15}$ cm$^{-2}$ in phosphorus and $2 \times 10^{15}$ cm$^{-2}$ in boron. As a result, an N-type impurity region 215 and a P-type impurity region 216 are formed. The impurity regions are apart from the gate electrodes by a thickness of the anodic oxide layers 210 and 212 and therefore it is in an offset gate state. The offset gate state is effective on decreasing a leak current (off current) when applying an inverse voltage (a minus voltage in a case of an N-channel TFT) to gate electrodes.

Figure 2D:
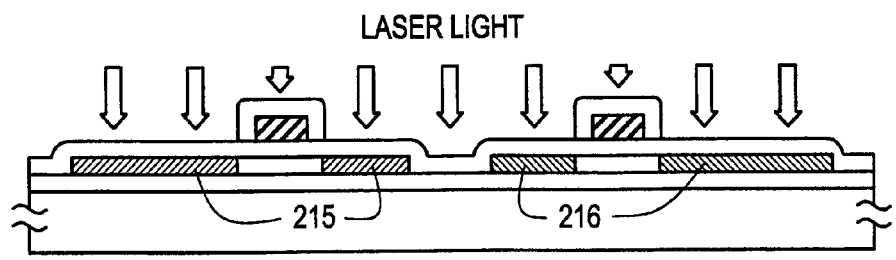

Annealing is performed by laser light irradiation. A laser light is a KrF excimer laser (wavelength of 248 nm and pulse width of 20 ns). As a laser light irradiation condition, an energy density is 200 to 400 mJ/cm$^2$, for example, 250 mJ/cm$^2$. The number of shots is 2 to 10 shots, for example, 2 shots for each portion. To improve the effect, a substrate may be heated at about 200 to 450° C. when irradiating the laser light. By this process, the regions 213 and 214 which a crystallinity is insufficient have a sufficient crystallinity. These regions are used as a source or a drain in a TFT. (FIG. 2D)

Figure 2E:
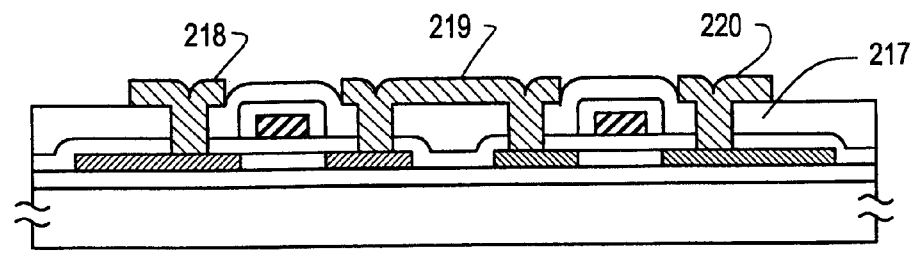

A silicon oxide film 217 having a thickness of 6000 Å is formed as an interlayer insulator by plasma CVD. Contact holes are formed in the interlayer insulator 217, and then electrode-interconnects (wirings) 218 to 220 of a TFT are formed by a multilayer film of metallic materials, for example, titanium nitride and aluminum. Annealing is performed at 350° C. in an atmosphere containing hydrogen at one air pressure for 30 minutes, to perform hydrogenation of silicon. The hydrogenation may be performed by implanting an accelerated hydrogen ion at 0.001 to 5 atoms % by ion doping. As a result, an active matrix pixel circuit having TFTs is completed. (FIG. 2E)

EMBODIMENT 3

Figure 5:
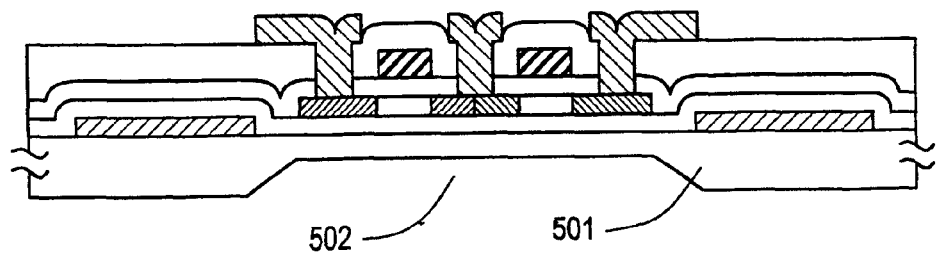
FIG. 5 is a schematic view of a cross section of a TFT according to further another embodiment of the present invention.

In the embodiment, a thin region is formed in a substrate, and a TFT is formed on the thin region. FIG. 5 shows a schematic view of a cross section of a TFT. A thin region 502 having, for example, a size of 50×200 μm and a thickness of 50 μm is formed in a substrate 501 having a thickness of 1.1 mm. On such region 502, by a thermal insulating effect, a cooling speed of a silicon film is slow and the same effect as shown in FIG. 4 is obtained.

As a result, crystals having a sufficient size are obtained in a silicon film on the region 502. However, since the substrate is thick in another region, a crystallinity of an obtained crystalline silicon film is not so high. In the embodiment, as similar to Embodiment 1, an aluminum nitride film is selectively formed on a substrate, and then a silicon oxide film as a base film and an amorphous silicon film are deposited.

Further, a KrF excimer laser (wavelength of 248 nm and pulse width of 30 ns) is irradiated in vacuum. An energy density in a laser to be irradiated is 200 to 450 mJ/cm$^2$. A substrate temperature is a room temperature. As a result, regardless of laser irradiation at a room temperature, as similar to another embodiment, a crystal growth having a transverse direction, that is, a crystal growth from an aluminum nitride region to a surrounding region, is observed. As a typical characteristic of a TFT produced by the obtained crystalline silicon film, a mobility is 250 to 750 cm$^2$/Vs in an N-channel type.

By the present invention, a TFT having at least a channel forming region constructed by substantially single crystalline silicon film can be produced. As a result, characteristics of a TFT are improved largely. The present invention can-be applied to not only a TFT but also a device using another thin film semiconductor and is effective on improving these characteristics.

Also, in the embodiments, a thin film semiconductor device such as a TFT formed on an insulating substrate is described. However, the present invention is effective with respect to a TFT formed on a single crystalline semiconductor substrate.

In a conventional crystallization process after laser irradiation, since a crystal nucleus does not produce stably, a crystallinity of an obtained silicon film is changed largely by a laser energy. That is, if an energy is too low, since a silicon film is not melted sufficiently, a crystal growth is insufficient. Also, if an energy is too high, since a silicon film is melted completely, a crystal nucleus does not produce in a cooling process, so that it is in a overcooling state and the silicon film becomes amorphous. Therefore, an optimum laser energy is determined within a narrow range under a condition that a film is melted sufficiently and a portion as a crystal nucleus remains.

However, in a cooling process after irradiation of laser light or the like in the present invention, a portion (high thermal conductivity material film to be selectively formed) in which a crystal nucleus produces first is predetermined and therefore a crystal growth progresses from the crystal nucleus in any cooling process. In an extremely wide energy range that a film is melted sufficiently and is not evaporated, a silicon film having about the same crystallinity can be obtained stably.

In a conventional laser crystallization, since an optimum laser energy range is narrow as described above, characteristics of an obtained thin film semiconductor device are not stable and mass production is low. Since the optimum laser energy range is extended sufficiently by the present invention, characteristics of the obtained semiconductor device are stable. Therefore, laser crystallization of the present invention is a semiconductor process having high mass production. The present invention is useful on industry.

What is claimed is:

1. A semiconductor device comprising:
    a substrate having an insulating surface;
    at least one film comprising aluminum and nitrogen formed over the substrate, said film having a thickness of 300 to 1000 Å;
    an insulating film formed on the film;
    a plurality of thin film transistors on the insulating film, each of the thin film transistors comprising a semiconductor island and a gate electrode over the semiconductor island,
    wherein the film comprising aluminum and nitrogen controls heat flow in the semiconductor island.

2. A device according to claim 1 wherein said film comprises aluminum nitride.

3. A device according to claim 1 wherein said semiconductor island includes hydrogen at a concentration of 0.001 to 5 atoms %.

4. A device according to claim 1, further comprising an interlayer insulating film over the thin film transistors.

5. A device according to claim 4 wherein said insulating film comprises silicon and oxygen.

6. A device according to claim 1 wherein said semiconductor device is an active matrix type display device.

7. A device according to claim 1 wherein said semiconductor island has a crystal orientation other than a main crystal orientation of 1% or less by a structure analysis method selected from the group consisting of an X-ray diffraction method and a Raman scattering spectroscopic analysis.

8. A semiconductor device comprising:
a substrate having an insulating surface;
at least one film comprising aluminum and nitrogen formed over the substrate, said film having a thickness of 300 to 1000 Å;
an insulating film formed on the film;
an n-channel thin film transistor and a p-channel thin film transistor on the insulating film, each of the thin film transistors comprising a semiconductor island and a gate electrode over the semiconductor island,
wherein the film controls heat diffusion of the semiconductor island.

9. A device according to claim 8 wherein said film comprises aluminum nitride.

10. A device according to claim 8 wherein said semiconductor island includes hydrogen at a concentration of 0.001 to 5 atoms %.

11. A device according to claim 8, further comprising an interlayer insulating film over the thin film transistors.

12. A device according to claim 11 wherein said insulating film comprises silicon and oxygen.

13. A device according to claim 8 wherein said semiconductor device is an active matrix type display device.

14. A device according to claim 8 wherein said semiconductor island has a crystal orientation other than a main crystal orientation of 1% or less by a structure analysis method selected from the group consisting of an X-ray diffraction method and a Raman scattering spectroscopic analysis.

15. A semiconductor device comprising:
a substrate having an insulating surface;
at least one film comprising aluminum and nitrogen formed over the substrate, said film having a thickness of 300 to 1000 Å;
an insulating film formed on the film;
an n-channel thin film transistor and a p-channel thin film transistor on the insulating film, each of the thin film transistors comprising a semiconductor island and a gate electrode over the semiconductor island,
wherein the film controls cooling speed of the semiconductor island.

16. A device according to claim 15 wherein the gate electrode does not overlap with the film comprising aluminum and nitrogen.

17. A device according to claim 15 wherein a thermal conductivity of the film is higher than that of the semiconductor island.

18. A device according to claim 15 wherein the film comprises aluminum nitride.

19. A device according to claim 15 wherein said semiconductor island includes hydrogen at a concentration of 0.001 to 5 atoms %.

20. A device according to claim 15, further comprising an interlayer insulating film over the thin film transistors.

21. A device according to claim 20 wherein said insulating film comprises silicon and oxygen.

22. A device according to claim 15 wherein said semiconductor device is an active matrix type display device having at least one thin film transistor.

23. A device according to claim 15 wherein said semiconductor island has a crystal orientation other than a main crystal orientation of 1% or less by a structure analysis method selected from the group consisting of an X-ray diffraction method and a Raman scattering spectroscopic analysis.

24. A semiconductor device comprising:
a substrate having an insulating surface;
at least one film having a thermal conductivity and formed over said insulating surface, said film having a thickness of 300 to 1000 Å;
an insulating film formed over the film; and
a plurality of thin film transistors on the insulating film, each of the thin film transistors comprising a semiconductor island and a gate electrode over the semiconductor island,
wherein said thermal conductivity of said film is higher than those of the insulating film and the semiconductor island, and
wherein the film controls heat flow in the semiconductor island.

25. A device according to claim 24 wherein said film having the thermal conductivity comprises a material selected from the group consisting of aluminum nitride, boron nitride, and diamond.

26. A device according to claim 24 wherein said semiconductor island includes hydrogen at a concentration of 0.001 to 5 atoms %.

27. A device according to claim 24, further comprising an interlayer insulating film over the thin film transistors.

28. A device according to claim 27 wherein said insulating film comprises silicon and oxygen.

29. A device according to claim 27 wherein said semiconductor device is an active matrix type display device having at least one thin film transistor.

30. A device according to claim 27 wherein said semiconductor island has a crystal orientation other than a main crystal orientation of 1% or less by a structure analysis method selected from the group consisting of an X-ray diffraction method and a Raman scattering spectroscopic analysis.

31. A semiconductor device comprising:
a substrate having an insulating surface;
at least one film having a thermal conductivity and formed over the insulating surface, said film having a thickness of 300 to 1000 Å;
an insulating film formed over the film, and
an n-channel thin film transistor and a p-channel thin film transistor on the insulating film, each of the thin film transistors comprising a semiconductor island and a gate electrode over the semiconductor island,
wherein said thermal conductivity of said film is higher than those of the insulating film and the semiconductor island, and
wherein the film controls heat diffusion of the semiconductor island.

32. A device according to claim 31 wherein said film having the thermal conductivity comprises a material selected from the group consisting of aluminum nitride, boron nitride, and diamond.

33. A device according to claim 31 wherein said semiconductor island includes hydrogen at a concentration of 0.001 to 5 atoms %.

34. A device according to claim 31 further comprising an interlayer insulating film over the thin film transistors.

35. A device according to claim 32 wherein said insulating film comprises silicon and oxygen.

36. A device according to claim 31 wherein said semiconductor device is an active matrix display device.

37. A device according to claim 31 wherein said semiconductor island has a crystal orientation other than a main crystal orientation of 1% or less by a structure analysis method selected from the group consisting of an X-ray diffraction method and a Raman scattering spectroscopic analysis.

38. A semiconductor device comprising:
   a substrate having an insulating surface;
   at least one film having a thermal conductivity and formed over to the insulating surface, said film having a thickness of 300 to 1000 Å;
   an insulating film formed over the film; and
   a plurality of thin film transistors on the insulating film, each of the thin film transistors comprising a semiconductor island and a gate electrode over the semiconductor island,
   wherein said the thermal conductivity is higher than those of the insulating film and the semiconductor island.

39. A device according to claim 38 wherein the gate electrode does not overlap with the film having the thermal conductivity.

40. A device according to claim 38 wherein the semiconductor island is crystallized by laser irradiation.

41. A device according to claim 38 wherein said first film comprises a material selected from the group consisting of aluminum nitride, boron nitride, and diamond.

42. A device according to claim 38 wherein said semiconductor island includes hydrogen at a concentration of 0.001 to 5 atoms %.

43. A device according to claim 38 further comprising an interlayer insulating film over the thin film transistors.

44. A device according to claim 43 wherein said insulating film comprises silicon and oxygen.

45. A device according to claim 38 wherein said semiconductor device is an active matrix display device.

46. A device according to claim 38 wherein said semiconductor island has a crystal orientation other than a main crystal orientation of 1% or less by a structure analysis method selected from the group consisting of an X-ray diffraction method and a Raman scattering spectroscopic analysis.

* * * * *